(12) United States Patent
Liljedahl et al.

(10) Patent No.: US 7,291,859 B2
(45) Date of Patent: Nov. 6, 2007

(54) ORGANIC ELECTRONIC CIRCUIT AND METHOD FOR MAKING THE SAME

(75) Inventors: Rickard Liljedahl, Linköping (SE); Goran Gustafsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 135 days.

(21) Appl. No.: 11/185,860

(22) Filed: Jul. 21, 2005

(65) Prior Publication Data

US 2006/0091435 A1   May 4, 2006

(30) Foreign Application Priority Data

Jul. 22, 2004   (NO)   .................................. 20043163

(51) Int. Cl.
*H01L 35/24* (2006.01)

(52) U.S. Cl. .................... 257/40; 257/295; 257/3; 257/4; 257/E45.002

(58) Field of Classification Search ................ 257/295, 257/40
See application file for complete search history.

(56) References Cited

U.S. PATENT DOCUMENTS

| | | | | |
|---|---|---|---|---|
| 5,146,299 | A * | 9/1992 | Lampe et al. ................ | 257/295 |
| 6,955,939 | B1 * | 10/2005 | Lyons et al. ................... | 438/82 |
| 2006/0018175 | A1 * | 1/2006 | Liljedahl et al. ............ | 365/222 |

FOREIGN PATENT DOCUMENTS

| | | |
|---|---|---|
| DE | 27 05 407 A1 | 8/1977 |
| JP | 10-81951 A | 3/1998 |
| WO | WO-03/044801 A1 | 5/2003 |
| WO | WO-03/052762 A1 | 6/2003 |

OTHER PUBLICATIONS

Haisheng Xu et al., J. Appl. Polymer Science, vol. 88, 2003, pp. 1416-1419.
D K Das-Gupta et al., J. Appl. Phys. D: Appl Phys., vol. 23, 1990, pp. 1485-1490.
P. Bloβ et al., Rev. Sci. Instrum., vol. 65, No. 5, 1994, pp. 1541-1550.
F. Feller et al., Applied Physics Letters, vol. 79, No. 6, 2001, pp. 779-781.

* cited by examiner

*Primary Examiner*—Tu-Tu Ho
(74) *Attorney, Agent, or Firm*—Birch, Stewart, Kolasch & Birch, LLP

(57) ABSTRACT

In an organic electronic circuit, particularly memory circuit with an organic ferroelectric or electret material the active material comprises fluorine atoms and consists of various organic materials. The active material is located between first and second electrode sets constituting respectively bottom and top electrodes of the device. A cell with a capacitor like structure is defined in the active material and can be accessed for an addressing operation via the electrodes. At least one top electrode comprises a layer of gold in contact with active material. A second layer on the top electrode comprises conducting material different from gold or can alternatively also be made of gold. A via connection extends between the second electrode layer and a bottom electrode or another electrode in the bottom electrode layer. In case the second electrode layer is made of gold the via metal of the via connection can also be gold and integral with the second electrode layer. In a method for establishing a top via electrode connection in the device, a first top electrode layer of gold is deposited and a via hole etched therethrough and down to the bottom electrode layer, and via metal is deposited to form a via connection and then a second top electrode layer is deposited above the first electrode layer of gold and contacting the via connection.

17 Claims, 4 Drawing Sheets

ORGANIC ELECTRONIC CIRCUIT AND METHOD FOR MAKING THE SAME

The present invention concerns an organic electronic device, particularly a memory circuit, with an organic ferroelectric or electret active material, wherein the active material comprises fluorine atoms and consists of single molecules, oligomers, homopolymers, copolymers, or blends or compounds thereof, wherein the active material is in contact with a first set of electrodes constituting bottom electrodes of the device and a second set of electrodes constituting top electrodes of the device, such that cells with a capacitor-like structure is defined in the active material and can be accessed electrically directly or indirectly via the electrodes; as well as a method in the fabrication of an organic electronic device, or a passive matrix-addressable array of such devices, wherein the device particularly is a memory device, wherein the memory device comprises an organic ferroelectric or electret active material, wherein the active material comprises fluorine atoms and consists of single molecules, oligomers, homopolymers, copolymers, or blends or compounds thereof, wherein the active material is in contact with a first set of electrodes constituting bottom electrodes of the device and a second set of electrodes constituting top electrodes of the device, such that cells with a capacitor-like structure is defined in the active material and can be accessed electrically directly or indirectly via the electrodes.

The bottom electrodes are usually termed bit line electrodes of the device, while top electrodes are termed the word lines of the device on the opposite side of the active material. If the device of the present invention is a matrix-addressable device, the word line and bit lines preferably are mutually orthogonal. Both the word line and the bit line electrodes shall somehow be connected to external circuitry for providing driving, control, error-correcting or sensing functions and in many cases such external circuitry are provided for instance as CMOS circuits in a silicon-based substrate of the device, which in this case is termed hybrid, i.e. it consists of an organic active material, e.g. memory material, as well as inorganic integrated CMOS circuits in the substrate. It should be noted that several such devices can be stacked upon each other to form a volumetric apparatus, but in any case it will be necessary to provide connections between the electrodes of the different devices as well as between electrodes in the first and second electrode layers of the latter and ultimately down to the substrate in order to have the desired functionality implemented in the volumetric device.

In some architectures or geometries this can be done by using so-called staggered over-the-edge vias down to a substrate or a backplane carrying one or more devices of this kind. Most commonly the active material is provided as a global layer extending over the whole surface of each device and with the word line and bit line electrodes patterned and appropriately oriented in the surrounding electrode layers. To keep connections and interconnect routings as short as possible, vias connecting electrodes in one layer with electrodes in another layer or electrodes in a stacked device with the electrodes in other devices of the stack ultimately establish a down-connection to circuitry in the substrate. This down-connection can be formed by providing vias extending through the active layers, i.e. the functional materials or devices which in this case is organic. This solution, however, is not without problems. Through-going vias of this kind in say organic ferroelectric and electret materials come with a penalty, as the conventional methods based on microphotolithography and etching, while being speedy and of low cost, have a detrimental effect upon the properties of the active material, mainly due to chemical and sometimes thermal interactions which although being compatible with most inorganic circuit materials, do not sit very well with the organic ones.

Hence the primary object of the present invention is to provide a novel via electrode interconnection in circuits of this kind, such that the processing problems largely are avoided and conventional patterning of holes for the via connections can be applied without adverse effect.

Another object of the present invention is to provide an improved via metal electrode contact.

Finally there is also an object of the present invention to provide a method for fabricating via-electrode connections of this kind The above objects as well as further features and advantages are realized according to the present invention with a device characterized in that at least one of the top electrodes comprises a first electrode layer of gold adjacent to and contacting the active material, and a second electrode layer of a conducting material provided over the first layer and contacting a via connection extending through the first electrode layer of gold and the active material down to contact with a bottom electrode or an electrode provided in the same layer as the bottom electrodes, as well as with a method characterized by steps for depositing a layer of gold as the first layer of the top electrode, etching a via hole in the layer of gold and through the active material down to a bottom electrode or an electrode deposited in a bottom electrode layer, depositing a via metal in the etched via hole and to contact with the bottom electrode or the electrode deposited in the bottom electrode layer, patterning and etching the first layer of gold, and depositing a second electrode layer of conducting material atop the gold layer and contacting the via metal, and patterning and etching the top electrode to form a desired electrode pattern and that the via opening is wholly contained within the footprint of gold electrode layer.

BRIEF DESCRIPTION OF THE DRAWINGS

The invention shall now be described in more detail with reference to embodiments and in conjunction with the appended drawing figures, of which

DETAILED DESCRIPTION OF THE INVENTION

Figure 1:
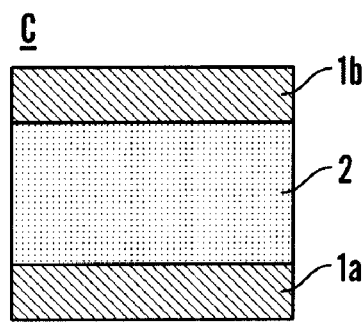
FIG. 1 shows an embodiment of a circuit or a cell as used in a device according to the present invention, but with a structural disposition known in the prior art, FIG. 2 schematically another embodiment of a circuit or cell as used in the device according to the present invention, FIG. 3 a two-layered top electrode with a layer of gold as used in the device according to the invention, FIG. 4 a preferred embodiment of a via-electrode connection as used in a top electrode of the device according to the invention, FIG. 5 a plan view of the device according to the present invention in the form of a matrix-addressable array, FIG. 6 a cross section of a volumetric embodiment of an apparatus comprising a stack of matrix-addressable devices like the one in FIG. 5, and FIGS. 7*a* and 7*b* a flow chart of steps in the method according to the present invention.

FIG. 1 shows the general structure of a memory circuit C which could be used as a cell in the device M of the present invention when configured for data storage. Electrodes 1a and 1b are interfacing the memory material 2 in a configuration corresponding to a parallel plate capacitor. It is structurally similar to prior art capacitive memory circuits, as for instance used in DRAM circuits and ferroelectric memories generally. The memory material of the circuit is an organic ferroelectric of electret material, preferably P(VDF-TrFE). Generally an array of cells or circuits of this kind is formed on a substrate and the electrodes 1a, 1b are then formed by portions of patterned electrode layers, in which case the bottom electrode 1a may be part of bit line and the top electrode 1b part of a word line in a matrix-addressable array. Also the bottom electrode 1a in this case usually is provided on a substrate comprising the required circuitry for operating the device. The parent application is particularly concerned with realizing the bottom electrode 1a with at least one electrode layer of gold which as disclosed therein has been chemically modified by treatment with iodine or a iodine compound. Forming a bottom electrode of this kind is actually not a requirement of the present invention, but of course following the teachings of the parent application would be considered preferable.

Figure 2:
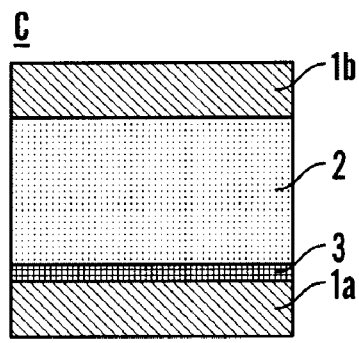

FIG. 2 shows another embodiment of e.g. a memory circuit C as used in the device M according to the present invention. Herein the bottom electrode 1a can specifically be considered as a layer of gold, while an adlayer 3 of iodine has been provided as an interlayer between the bottom electrode 1a and the memory material 2 which may be the aforesaid organic ferroelectric or electret polymer.

Figure 3:
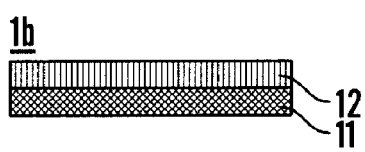

The structure of top electrode 1b of FIG. 1 and FIG. 2 is depicted in some detail in FIG. 3 which shows a cross section thereof. It comprises two separate layers 11 and 12 and according to the present invention the first electrode layer, i.e. the one closest to the memory material 2, is deposited as a layer of gold.

Figure 4:
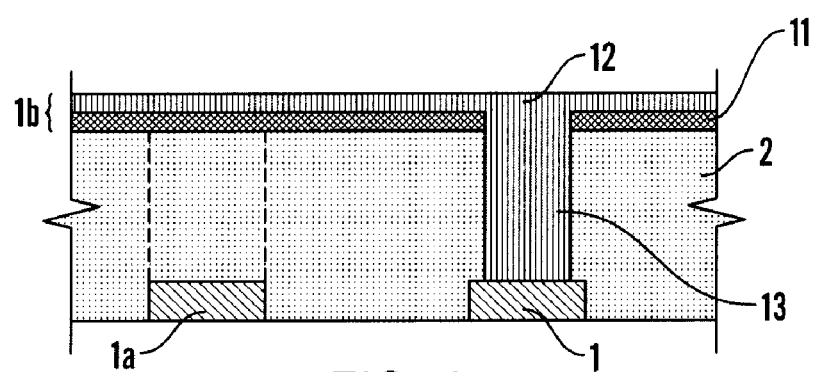

FIG. 4 shows a cross section of a wafer or memory device according to the present invention and wherein a matrix-addressable array is formed of elements like the circuits C shown in either FIG. 1 or FIG. 2. A cell or circuit C has been provided together with a via 13 connecting the top electrode 1b to an assigned bottom electrode 1 which need not be identical with the bottom electrode 1a, but could as well be another electrode provided in the same layer as the bottom electrodes 1a of the memory device. The via connection 13 contacts of a second layer 12 of top electrode 1b. It is deposited in the via hole which has been provided through a first top electrode layer 11 of gold and the memory material 2. By providing a first top electrode layer 11 of gold it will now be easy to form a via opening for accommodating a via 13 through the active material 2 by conventional patterning, i.e. microphotolitography and subsequent etching without damaging the active memory material 2 in the regions thereof outside the via hole. The second electrode layer 12 of the top electrode 1b is now provided as an additional electrode layer and at the same time the electrode material thereof also constitutes the via metal in the via connection 13. In other words the top electrode layer 12 and the via material is one and the same and could for instance be any of the above-mentioned materials, i.e. copper, aluminium, or titanium which is deposited on the gold layer of the top electrode 1b. However, there is nothing that precludes the use of gold for the layer 12, which indeed as shall be related below can prove advantageous. On the other hand it is not required that the via connection 13 also is made of gold. As a matter of fact the second top electrode layer 12 and the via connection 13 can be made of different materials, but the advantage of using one and the same material should be obvious to a person skilled in the art. Neither does the present invention require that the bottom electrodes for instance 1a in FIGS. 1, 2 and 4, or 1 in FIG. 4 actually should be made of gold, but as set forth in the parent application this can be considered advantageous as long as the teachings disclosed therein are adhered to.

Figure 5:
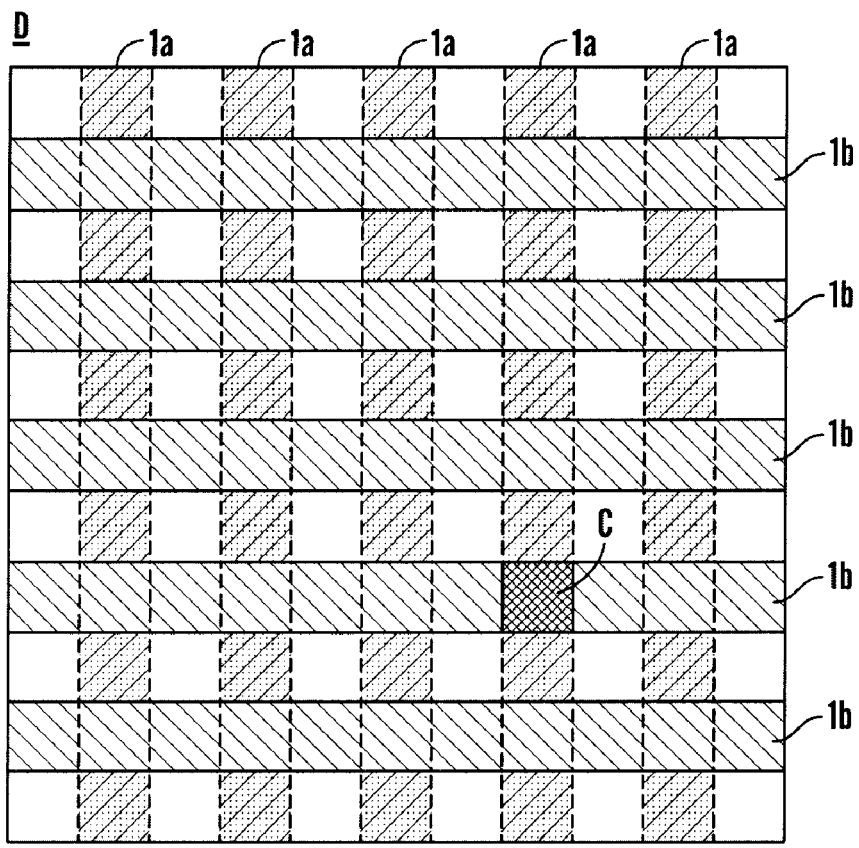

FIG. 5 shows an embodiment of the present invention where cells or memory circuits C constitute the elements of a matrix-addressable array, which e.g. can be regarded as a passive matrix-addressable memory device. Passive matrix-addressable memories differ from active matrix-addressable memories, as no switching means are provided in the former and the memory cells contact the addressing electrodes permanently. Basically a memory device of this kind is formed with a first set of parallel stripe-like electrodes 1a, followed by a global layer of ferroelectric memory material, e.g. a ferroelectric polymer like P(VDF-TrFE), over which are provided another electrode set comprising likewise parallel stripe-like electrodes 1b, but oriented orthogonally to the electrodes 1a, so as to form an orthogonal electrode matrix. The electrodes 1a can e.g. be regarded as the bit lines of a matrix-addressable memory device, while the electrodes 1b can be regarded as the word lines thereof. At the crossings between the bit lines 1a and word lines 1b a memory cell is defined in the matrix in the global layer of memory material 2. Thus the memory device will comprise a plurality of memory circuits C corresponding to the number of electrode crossings in the matrix. A memory circuit C corresponds to one of the previously presented embodiments of the organic electronic circuit according to the present invention. It shall be understood that a memory device M of the kind shown in FIG. 5 can be provided with an insulating layer over the electrodes 1a (or a so-called separation layer) and then a second similar device can be stacked on the top thereof and so on to form a stacked or volumetric memory device as known in the prior art. It is to be understood that electrodes 1a, 1b forming the respectively word and bit lines of the memory device M in FIG. 5 all will be connected with suitable driving, control and sensing circuits for performing write/read operations to the memory cells of the matrix-addressable memory device, although the peripheral external circuitry is not shown in the drawing figures.

As previously mentioned, special care has to be taken in the manufacturing process to achieve memory circuits with improved performance according to the invention. Generally it is important to avoid contaminations of any interface in physical contact with the memory material, i.e. to assure clean interfaces. This can be particularly hard to achieve for a bottom electrode since the top surface of the bottom electrode will be openly exposed in the process, at least for a period starting after deposition of the electrode material and before the memory material has been deposited. This is typically less of a problem for the top electrode since the electrode material here is deposited directly on the surface of the memory material in one processing step. For the top electrode the main problem instead tend to be connected to via processing of the top electrode, i.e. when there are steps involved that shall etch through the memory material and connect to certain bottom electrodes assigned for via connections. During such via processing there is a substantial risk that the surface of the memory material may be subjected to contaminating species that will damage the memory material and that may cause undesired reactions in the interface between the top electrode and the memory material.

Figure 6:
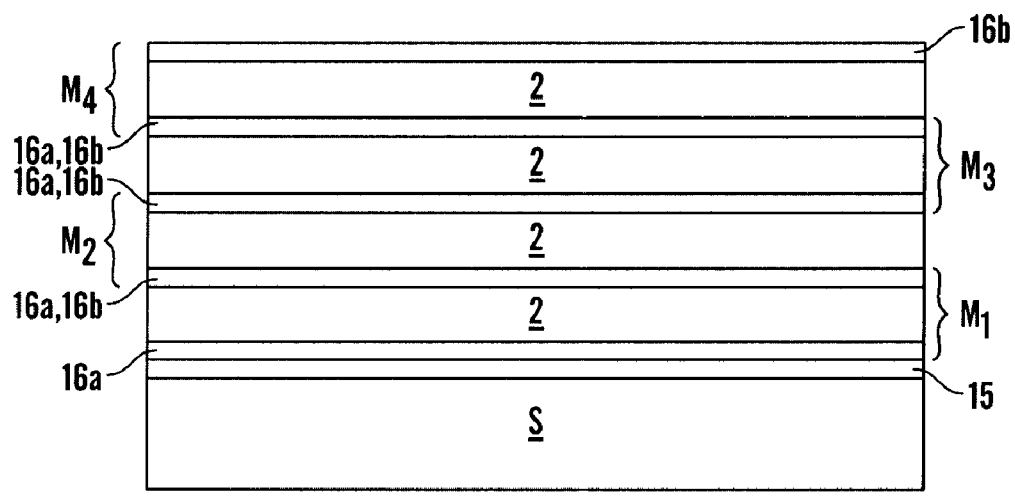

A volumetric apparatus can now be formed by stacking two or more devices according to the present invention upon each other and with the respective devices on the top for instance a substrate S as can be seen to advantage in FIG. 6. A preferred embodiment of a stacked volumetric device or apparatus based on the devices according to the present invention is shown in this figure.

Here the devices M are provided in a stack on a substrate S comprising an insulating surface layer 15. Now follows the bottom electrode layer 16a of the first memory device $M_1$ and according to the invention the gold can be appropriately chemically treated before the memory material 2 is provided on the top of this electrode. The next electrode layer, the top electrode layer 16b of the memory device $M_1$ is also provided as the bottom electrode layer 16a of the succeeding memory layer $M_2$ and so on. In other words, the top electrode layer of a memory device $M_k$ becomes the bottom electrode layer of a succeeding memory device $M_{k-1}$ and hence the electrode layers from the second to the second last in the stack alternatively takes the role of bit lines and word lines depending on which of the memory devices M that shall be addressed. At the same time, of course the shared electrode layers made of gold must be appropriately processed before the provision of the memory material over the top thereof.

Obviously a stacked data storage apparatus of this kind shall require via connections from any memory device in the stack down to circuitry located in the substrate, and the via connections can now advantageously of course be made in the manner discussed hereinabove. This, of course, implies that the top electrodes 1b, 16b of each memory device M in the volumetric data storage apparatus preferably can be provided as the two-layered electrodes of the present invention with at least the first layer thereof made of gold, and that appropriate via connections 13 are formed by allowing the material of the second electrode layer 12 to extend through via openings, which have been etched through the first gold layer 11 and the active material or memory material 2. Since the top electrodes 16b of each memory device from the second memory device in the stack also forms the bottom electrodes 16a of a succeeding memory device in the stack, a second layer 12 of gold in these electrodes must be appropriately treated before the active material 2 is provided thereon. In the volumetric apparatus in FIG. 6, obviously two adjacent memory devices, e.g. $M_2$, $M_3$ cannot be addressed simultaneously since the word lines 16b in the first one $M_2$ are the bit lines 16a in the following one $M_3$ and so on. This disadvantage is of course somewhat alleviated by the fact that still every second memory device M in the stack can be addressed in parallel and that the number of electrode layers in this case is not 2n as in conventional stacked architectures, where each stacked device has its own separate bottom and top electrodes, but instead are reduced to n+1, while separation layers are no longer required. It could also be noted that attempt to provide a volumetric data storage apparatus with the capability of simultaneous and parallel addressing of all memory devices M or memory planes can result in layout problems as it will require a number of sense amplifiers that would stand in a linear relation to the number of memory devices in the stack.

Figure 7A:
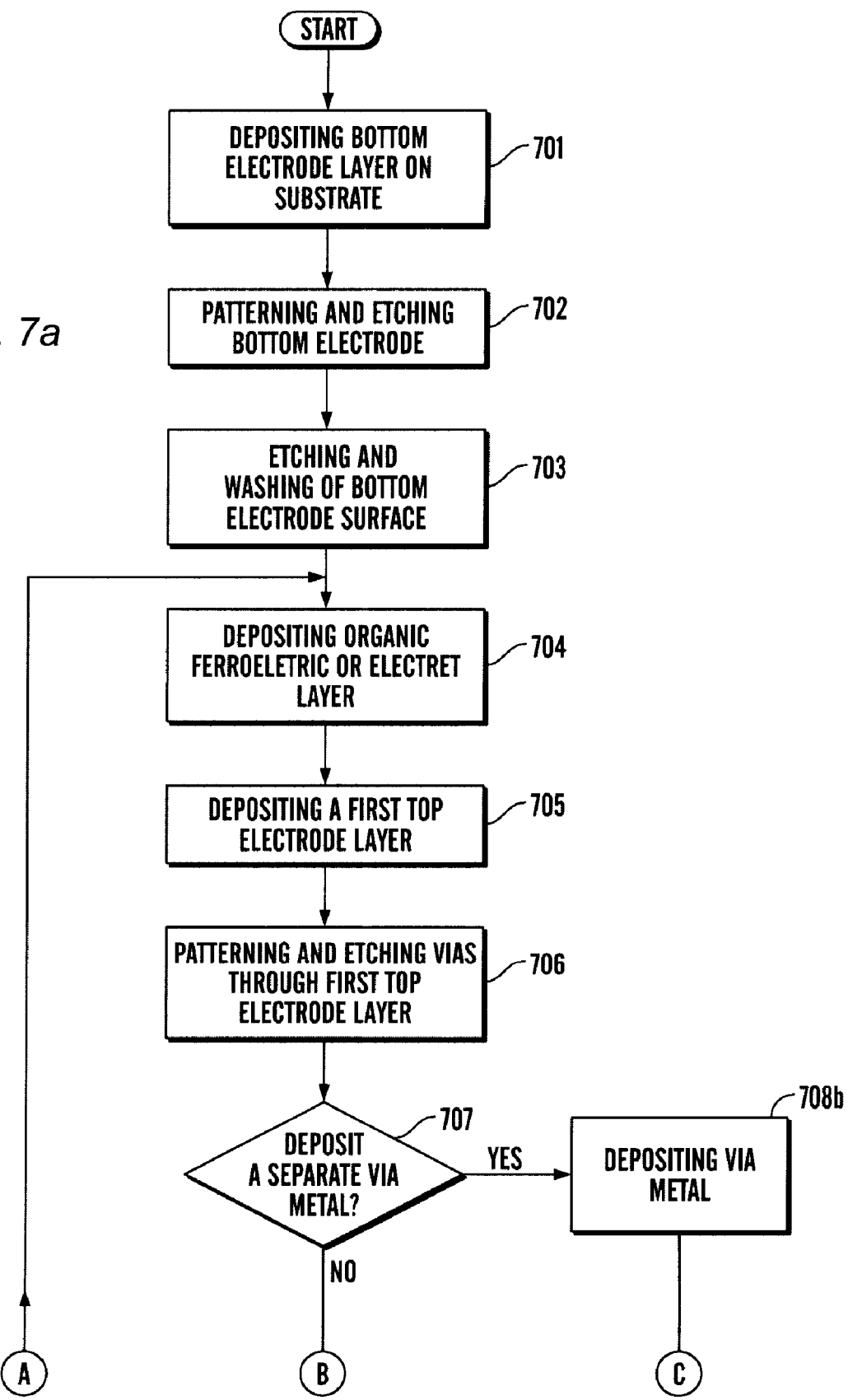
Figure 7B:
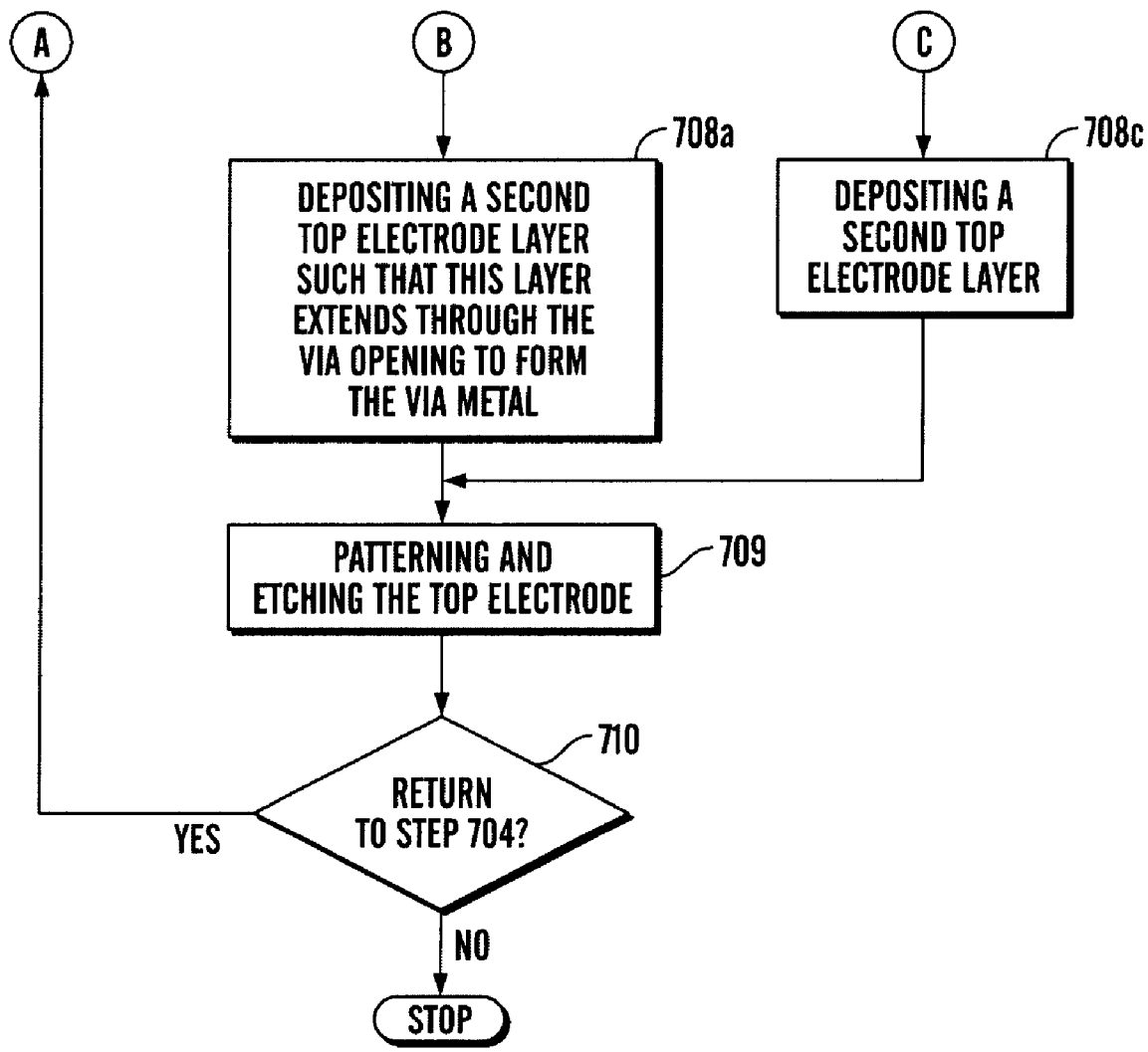

FIGS. 7a and 7b show important steps in a preferred embodiment of the method according to the present invention and as used in the manufacturing process of memory device according to the present invention on a wafer that employs circuits C as elements of a matrix-addressable array according to the present invention.

It should be noted that initial steps 701-704 is not a part of the present invention as such, but of course still is essential for realizing the deivce of the present invention.

In the preferred embodiment of the method a bottom electrode layer of gold (Au) is deposited on an insulating substrate consisting of $SiO_2$. The deposition in step 701 is made by sputtering, although resistive evaporation or electron-beam evaporation are possible alternatives. The thickness of the Au layer is advantageously in the interval 30-90 nm. In a particular embodiment a titanium (Ti) layer with thickness of 5-10 nm is added between the substrate and the Au layer in order to increase adhesion. The bottom electrode 1a is then patterned in step 702 with conventional microphotolithography followed by wet and dry etching. After the patterning process, the photoresist is stripped off with conventional dry or wet stripping methods. An alternative is to deposit the bottom electrode 1a using moulding means, e.g. to deposit the material using recesses formed in the substrate as accounted for in connection with the discussion related to FIG. 5. Next the surface of the bottom electrode is etched in step 703 by exposing it to a solution that etches the electrode material, here potassium iodine (KI) in a mixture of ethanol and de-ionized water. The concentration of KI should be in the range 0.5-10 mmol/l. Other solutions that are possible include $I_2$ in isopropyl alcohol or potassium iodine in isopropyl alcohol. It is considered advantageous to use solutions comprising iodine atoms because of iodine modification effects, as for example in the case of iodine-modified gold. A preferred technique is to use dipping of the wafers in the solution for a predetermined time period that can be up to approximately a minute, followed by washing in water, dipping in isopropanol, spin-rinsing in de-ionized water and drying in $N_2$. Alternative methods include spin coating or spraying. Next a layer of organic electret or ferroelectric material is deposited in step 704, here in the form of a polymer layer 2 of P(VDF-TrFE) that is globally spin coated on the wafer. The thickness is typically selected in the interval 20 nm to 200 nm. The deposited polymer is then annealed, typically on a hot plate or in a convection oven.

These steps are inherent of and part of the inventive method as disclosed in the parent application.

Now the top electrode 1b and the via 13 according to the present invention shall be deposited in steps 705-709. According to the present invention a top electrode 1b with at least one layer 11 of gold shall now be provided and also a connection from the top electrode 1b through the layer of organic active material 2, for instance a ferroelectric polymer, is required. A connection of this kind is nearly always topical in matrix-addressable ferroelectric memories where via connections of metal shall be formed in the global thin film of memory material in order to obtain a connection with e.g. circuitry for driving, control, error correction and sensing provided in the substrate and usually realized in CMOS technology, as will be the case with so-called hybrid polymer memory chips, wherein apart from the matrix-addressable memory itself, all other circuits are realized in inorganic material, e.g. in silicon, due to speed, power and integration requirements.

By resorting to gold as the electrode metal of the top electrode 1b, using a two-layer process, a first electrode layer 11 of gold is deposited on the top of the polymer layer 2. The structure and arrangement of two-layer top electrodes with at least one layer 11 of gold is shown in FIGS. 3 and 4.

The gold layer 11 is deposited in step 705, for instance by physical vapour deposition (PVD), to a thickness of 30 to 90 nm. The gold layer 11 constitutes the bottom or interface part of the top electrode 1b and will act both as electrode and as a protective layer for the underlying organic memory material 2 during the following via etching step 706. The organic memory material 2 is protected by the gold layer 11 during the via processing. This is possible due to the fact that the gold is chemically inert. When an interlayer is provided between the electrode metal and e.g. a polymer memory material, as disclosed in prior art, the interlayer itself protects the memory material. Via processing is particularly a problem in devices with memory circuits as may be found in the device according to the present invention and has to be solved accordingly in order to achieve high performance memory circuits. The via openings are patterned using conventional microphotolithography followed by wet and dry etching. The photoresist is then stripped off with conventional wet stripping methods. In a decision step 707 one now has the option of improving the via conductivity by for instance using a separate via plug, e.g. of tungsten (wolfram) as known in the art. In step 708a a second layer 12 of gold or another well-conducting electrode material is deposited on top of the first gold layer 11 and the first and second layers 11, 12 together constitute the top electrode 1b. The minimum thickness of the second layer 12 is dependent on thickness of the first layer 11 and on the deposition technique, e.g., in the case of PVD it is dependent on the degree of step coverage. The second layer 12 of the top electrode 1b thus connects the top electrode with the drive electronics in the substrate through the vias 13 extending through the via openings etched in step 706 to the assigned bottom electrodes 1a. The top electrode 1b is finally patterned in step 709 using conventional microphotolithography followed by wet etching. The photoresist is stripped off with dry or wet stripping methods. It should be noted that in case of dry stripping, parts of the organic memory material that is not protected by the top electrode will also be stripped off, and hence the material according to the present invention reduces the risk of delamination between the polymer layer and the insulating substrate.

An alternative to the last step 709 is to deposit a thin layer of titanium for use as a hard mask in the top electrode etching process. The titanium layer is patterned with conventional microphotolithography followed by wet or dry etching. The photoresist is then stripped off with dry or wet stripping methods.

A second option would be to deposit a separate via metal in step 708b. The use of separate via plugs is known in the art and in order to improve conductivity these could be made of e.g. tungsten as known in the art. After depositing the via metal, a second top electrode layer 12 is deposited in step 708c and establishes the required contact. Patterning and etching of the top electrode takes place in step 709 as in the first option.

If the device according to the present invention shall be stacked to form a volumetric apparatus, the process in the flow chart of FIGS. 7a and 7b returns via the decision step 710 to step 704 and the subsequent steps 705, 709 are repeated a number of times, said number of course determining how many devices that constitute the stack. If the top electrode layer 12 in this case is made of gold, which can be advantageous, it will be chemically modified by treatment with a substance comprising iodine or iodine atoms and as disclosed in the parent application. This of course because the top electrode layer of the second electrode now also forms a top electrode layer in the bottom electrode of the succeeding device and so on.

Embodiments and examples have been presented hereinabove in order to provide concreteness to the invention and make it applicable to persons skilled in the art. It is not intended that specific references shall be considered as limitations of the scope of the invention, except from what is set forth in the accompanying claims.

The invention claimed is:

1. An organic electronic device forming a memory circuit, comprising:
    an organic ferroelectric or electret active material, wherein the active material includes fluorine atoms and comprises single molecules, oligomers, homopolymers, copolymers, or blends or compounds thereof;
    a first set of electrodes; and a second set of electrodes, wherein the active material is in contact with the first set of electrodes constituting bottom electrodes of the device and the second set of electrodes constituting top electrodes of the device, such that cells with a capacitor-like structure is defined in the active material and can be accessed electrically directly or indirectly via the first and second electrodes wherein at least one of the top electrodes comprises a first electrode layer of gold adjacent to and contacting the active material, a second electrode layer of a conducting material provided over the first layer and contacting a via connection extending through the first electrode layer of gold and the active material down to contact with a bottom electrode or an electrode provided in the same layer as the bottom electrodes.

2. An organic electronic device according to claim 1, wherein the conducting material of the second top electrode layer is different from the gold electrode material of the first layer.

3. An organic electronic device according to claim 2, wherein the conducting material of the second top electrode layer is copper, aluminium or titanium.

4. An organic electronic device according to claim 1, wherein the conducting material of the second top electrode layer is gold.

5. An organic electronic device according to claim 4, wherein an exposed top surface of the second gold top electrode layer is chemically modified by the iodine being provided in or at said surface.

6. An organic electronic device according to claim 5, wherein an adlayer of iodine atoms has been provided on the exposed surface of the second gold top electrode layer.

7. An organic electronic device according to claim 1, wherein the via connection is made of a metal different from the material of the second top electrode layer.

8. An organic electronic device according to claim 1, wherein the via connection is made of the same material as the second top electrode layer.

9. An organic electronic device according to claim 8, wherein the conducting material of the second top electrode layer and the via metal gold is provided integrated with each other.

10. An organic electronic device according to claim 1, wherein the organic active material comprises vinylidene fluoride (VDF) in oligomer, homopolymer or copolymer form.

11. An organic electronic device according to claim 8, wherein the vinylidene fluoride copolymer is polyvinylidene fluoride trifluoroethylene, P(VDF-TrFE).

12. An organic electronic device according to claim 1, wherein the device forms a layer in a stack of n such devices, and that the bottom electrodes 1a of device $M_k$ forms the top electrode of a preceding device, $M_{k-1}$, where $2 \leq k \leq n$.

13. A method in the fabrication of an organic electronic memory device, or a passive matrix addressable array of such devices, the memory device comprising;
   forming an organic ferroelectric or electret active material, wherein the active material includes fluorine atoms and comprises single molecules, oligomers, homopolymers, copolymers, or blends or compounds thereof;
   forming a first set and second set of electrodes, wherein the active material is in contact with the first set of electrodes constituting bottom electrodes of the device and the second set of electrodes constituting top electrodes of the device, such that cells with a capacitor-like structure is defined in the active material and can be accessed electrically directly or indirectly via the electrodes; and depositing a layer of gold as the first layer of the top electrode;
   etching a via hole in the layer of gold and through the active material down to a bottom electrode or an electrode deposited in a bottom electrode layer, depositing a via metal in the etched via hole and to contact with the bottom electrode or the electrode deposited in the bottom electrode layer; patterning and etching the first layer of gold and depositing a second electrode layer of conducting material atop the gold layer and contacting the via metal; and patterning and etching the top electrode to form a desired electrode pattern and such that the via opening is wholly contained within the footprint of the gold electrode layer.

14. A method according to claim 13, further comprising; providing the via connection and the electrode material of the second layer as one and the same material and the depositing this material in one and the same step whereby the via connection and the second electrode layer is formed in a continuous process.

15. A method according to claim 13, wherein the via metal and the electrode material of the second layer both being gold.

16. A method according to claim 15, further comprising; modifying an exposed top surface of the second gold layer chemically by means of a treatment with a substance comprising iodine or iodine atoms.

17. A method in fabrication according to claim 16, further comprising; providing an adlayer of iodine atoms in the exposed surface of the second gold layer.

* * * * *